United States Patent [19]

Gaylord et al.

[11] Patent Number: 4,987,458
[45] Date of Patent: Jan. 22, 1991

[54] SEMICONDUCTOR BIASED SUPERLATTICE TUNABLE INTERFERENCE FILTER/EMITTER

[75] Inventors: Thomas K. Gaylord; Kevin F. Brennan; Elias N. Glytsis, all of Atlanta, Ga.

[73] Assignee: Georgia Tech Research Corporation, Atlanta, Ga.

[21] Appl. No.: 374,476

[22] Filed: Jun. 30, 1989

[51] Int. Cl.$^5$ ............................................. H01L 27/12
[52] U.S. Cl. ........................................ 357/4; 357/18; 357/58; 357/30
[58] Field of Search ..................... 357/4, 16, 58, 30 E, 357/30 L

[56] References Cited

U.S. PATENT DOCUMENTS

3,882,533  5/1975  Döhler ............................... 357/4 X

OTHER PUBLICATIONS

Fowler et al, "Planar Superlattice Structure," *IBM Technical Disclosure Bulletin*, vol. 12, No. 12, May 1970, pp. 2237-2237a.
Heiblum, "Ballistic Electrons and Holes Observed in a Semiconductor," *Optics News*, Oct. 1988, pp. 13-16.
"Semiconductor Superlattice Electron Wave Interference Filters" by T. K. Gaylord and K. F. Brennan, *Appl. Phys. Lett.* vol. 53 (No. 21), Nov. 21, 1988, pp. 2047-2049.
A. Thielen, "Design of Multilayer Interference Filters," *Physics of Thin Films*, Edited by G. Hass and R. E. Thun, Advances in Research and Development, vol. 5, Academic Press, N.Y., 1969, pp. 47-87.
"Electron Wave Optics in Semiconductors", by T. K. Gaylord and K. F. Brennan, *J. Appl. Phys.*, vol. 65, No. 2, Jan. 15, 1989, pp. 814-820.
"Resonant Tunneling Through Quantum Wells at Frequencies up to 2.5 THz", by T. C. G. Sollner, W. D. Goodhue, P. E. Tannenwald, C. D. Parker, and D. D. Peck, *Appl. Phys. Lett.* vol. 43, No. 6, Sep. 15, 1983, pp. 588-590.
"Design Principles for CHIRP Superlattice Devices", by T. Nakagawa, N. J. Kawai, and K. Ohta, *Superlattices and Microstructures*, Academic Press Inc. Limited, vol. 1, No. 2, 1985, pp. 187-192.
"Observation of Negative Differential Resistance in CHIRP Superlattices", by T. Nakagawa, H. Imamoto, T. Sakamoto, T. Kojima, K. Ohta, and N. J. Kawai, *Electronics Letters*, vol. 21, No. 19, Sep. 12, 1985, pp. 882-884.
"Direct Observation of Ballistic Transport in GaAs", by M. Heiblum, M. I. Nathan, D. C. Thomas, and C. M. Knoedler, *Phy. Rev. Let.*, vol. 55, No. 20, Nov. 11, 1985, pp. 2200-2203.
"Variably Spaced Superlattice Energy Filter, a New Device Design Concept for High-Energy Electron Injection", by C. J. Summers and K. F. Brennan, *Appl. Phys. Lett.*, vol. 48, No. 12, Mar. 24, 1986, pp. 806-808.
"Resonant Tunneling Through a Double GaAs/AlAs Superlattice Barrier, Single Quantum Well Heterostructure", by M. A. Reed, J. W. Lee, and H-L. Tsai, *Appl. Phys. Lett.*, vol. 49, No. 3, Jul. 21, 1986, pp. 158-160.
"Electron Reflectance of Multiquantum Barrier (MOB)", by K. Iga, H. Uenohara, and F. Koyama, *Electronics Letters*, Sep. 11, 1986, pp. 1008-1010.
"Characterization of GaAs/AlGaAs Hot Electron Transistors Using Magnetic Field Effects on Launched-Electron Transport", by K. Imamura, S. Muto, N.

(List continued on next page.)

*Primary Examiner*—William Mintel
*Attorney, Agent, or Firm*—Michael B. Einschlag

[57] ABSTRACT

Continuously tunable, biased, semiconductor superlattice electron interference filter/emitter which can serve, for example, as a hot electron emitter in a ballistic transistor, provides energy selectivity for substantially ballistic electron wave propagation at electron energies above the superlattice potential barriers. The layers of the biased superlattice have alternatively high and low electron refractive indices wherein each layer is a quarter or half of an electron wavelength in thickness and wherein the quantum well barrier widths are adjusted in the direction of emission to provide the desired energy selectivity.

12 Claims, 2 Drawing Sheets

OTHER PUBLICATIONS

Yokoyama, M. Sasa, H. Ohnishi, S. Hiyamizu and H. Nishi, *Surface Science*, vol. 174, 1986, North-Holland, Amsterdam, pp. 481-486.

"Theory of Resonant Tunneling in a Variably Spaced Multiquantum Well Structure: An Airy Function Approach", by K. F. Brennan and C. J. Summers, *J. Appl. Phys.*, vol. 61, No. 2, Jan. 15, 1987, pp. 614-623.

"Observation of Millimeter-Wave Oscillations From Resonant Tunneling Diodes and Some Theoretical Considerations of Ultimate Frequency Limits", by T. C. L. G. Sollner, E. R. Brown, W. D. Goodhue, and H. Q. Le, *Appl. Phys. Lett.*, vol. 50, No. 6, Feb. 1987, pp. 332-334.

"Electron Interference Effects in Quantum Wells: Observation of Bound and Resonant States", by M. Heiblum, M. V. Fischetti, W. P. Dumke, D. J. Frank, I. M. Anderson, C. M. Knoedler, and L. Osterling, *Phys. Rev. Let.*, vol. 58, No. 8, Feb. 23, 1987, pp. 816-819.

"The Variably Spaced Superlattice Energy Filter Quantum Well Avalanche Photodiode: A Solid State Photomultiplier", by K. F. Brennan and C. J. Summers, *IEEE J. Qant. Elect.*, vol. QE-23, No. 3, Mar. 1987, pp. 320-327.

"The Variably Spaced Superlattice Electroluminescent Display: A New High Efficiency Electroluminescence Scheme", by K. F. Brennan and C. J. Summers, *J. Appl. Phys.*, vol. 61, No. 12, Jun. 15, 1987, pp. 5410-5418.

"A Pseudomorphic $In_{0.53}Ga_{0.47}As$/AlAs Resonant Tunneling Barrier with a Peak-to-Valley Current Ratio of 14 at Room Temperature", by T. Inata, S. Muto, Y. Nakata, S. Sasa, T. Fujii and S. Hiyamizu, *J. Appl. Phys.*, vol. 26, No. 8, Aug. 1987, pp. L1332-1334.

"Resonant Tunneling and Negative Differential Resistance in a Variably Spaced Superlattice Energy Filter", by. C. J. Summers, K. F. Brennan, A. Torabi and H. M. Harris, *Appl. Phys. Lett.*, vol. 52, No. 2, Jan. 11, 1988, pp. 132-134.

"Room-Temperature Observation of Resonant Tunneling Through an AlGaAs/GaAs Quasiparabolic Quantum Well Grown by Molecular Beam Epitaxy", by S. Y. CHou and J. S. Harris, Jr., *Appl. Phys. Lett.*, vol. 52, No. 17, Apr. 25, 1988, pp. 1422-1424.

"Observation of Electron Quantum Interference Effects Due to Virtual States in a Double Barrier Heterostructure at Room Temperature", by R. C. Potter and A. A. Lakhani, *Appl. Phys. Lett.*, vol. 52, No. 16, Apr. 18, 1988, pp. 1349-1351.

"Quantum Interference Effects in GaAs/GaAlAs Bulk Potential Barriers", by J. R. Hayes, P. England, and J. P. Harbison, *Appl. Phys. Lett.*, vol. 52, No. 19, May 9, 1988, pp. 1578-1580.

"Transmission Line Analogy of Resonance Tunneling Phenomena: The Generalized Impedance Concept", by A. N. Khondker, M. Rezwan Khan and A. F. M. Anwar, *J. Appl. Phys.*, vol. 63, No. 10, May 15, 1988, pp. 5191-5193.

"Theoretical Properties of Electron Wave Diffraction Due to a Transversally Periodic Structure in Semiconductors", by K. Kuruya and K. Kurishima, *IEEE J. Quan. Elect.*, vol. 24, No. 8, Aug. 1988, pp. 1652-1658.

Chapter 1, vol. VIII, Quantum Phenomena, by S. Datta, Modular Series on Solid State Devices, Edited by R. F. Pierret and G. W. Neudeck, Addison-Wesley Publishing Company, 1989, pp. 5-37.

"High-Gain Pseudomorphic InGaAs Base Ballistic Hot-Electron Device", by K. Seo, M. Heiblum, C. M. Knoedler, J. E. Oh, J. Pamulapati, and P. Bhattacharya, *IEEE Elect. Dev. Let.*, vol. 10, No. 2, Feb. 1989, pp. 73-75.

SEMICONDUCTOR BIASED SUPERLATTICE TUNABLE INTERFERENCE FILTER/EMITTER

This invention was made with Government support under Contract No. DDAL03-87-K-0059 awarded by U.S. Army Research Office. The Government has certain rights in the invention.

BACKGROUND OF THE INVENTION

The present invention pertains to voltage-biased, semiconductor superlattice structures and, in particular, to voltage-biased, semiconductor superlattice structures which provide a tunable electron wave interference filter/emitter that can serve, for example, as a hot electron emitter in a ballistic transistor.

Recent progress in semiconductor growth technologies, particularly in molecular beam epitaxy (MBE) and metal organic chemical vapor deposition (MOCVD), enable those of ordinary skill in the art to grow multi-layered superlattice structures with precise monolayer compositional control. For example, successively grown layers of narrow and wide band gap semiconductor materials such as GaAs and $Ga_{1-x}Al_xAs$ have been produced and widely used to provide multiple quantum well structures. Further, refinements of these methods have produced improvements in the crystalline quality of materials such as GaAs so that devices have been observed in which ballistic electron transport exists, that is, devices where conduction electrons move through the material without being scattered. Still further, reported experiments have shown that ballistic hole motion also occurs in GaAs, albeit at a lower fraction than that which occurs for electron motion due to the peculiar structure of the valence band of GaAs.

In accordance with a paper entitled "Electron Wave Optics In Semiconductors" by T. K. Gaylord and K. F. Brennan, in *J. Appl. Phys.*, Vol. 65, 1989, at p. 814 and a patent application entitled "Solid State Quantum Mechanical Electron and Hole Wave Devices," Ser. No. 07/272,175, which patent application was filed on Nov. 16, 1988, which patent application is commonly assigned with the present invention, and which patent application is incorporated by reference herein, ballistic electrons are quantum mechanical deBroglie waves which can be refracted, reflected, diffracted, and interferred in a manner which is analogous to the manner in which electromagnetic waves can be refracted, reflected, diffracted, and interferred. Further, phase effects for electron waves, such as path differences and wave interferences, may be described using a wavevector magnitude k given by:

$$k = [2m^*(E-V)]^{\frac{1}{2}}/\hbar \quad (1)$$

where m* is the electron effective mass, E is the total electron energy, V is the electron potential energy, and $\hbar$ is Planck's constant divided by $2\pi$. Still further, amplitude effects for electron waves, such as transmissivity and reflectivity, may be described in terms of an electron wave amplitude refractive index $n_e$ (amplitude) which is given by:

$$n_e(\text{amplitude}) \alpha [(E-V)/m^*]^{\frac{1}{2}} \quad (2)$$

Using eqn. (1) and (2), the characteristics of an unbiased, many boundary semiconductor lattice can be determined in accordance with the material disclosed in the above-cited patent application. For example, this patent application discloses the type of performance one can expect from narrow, bandpass interference filters comprised of a half-wavelength semiconductor layer which is sandwiched between semiconductor reflectors, which semiconductor reflectors comprise stacks of high index, designated H, and low index, designated L, quarter-wavelength semiconductor layers. Further, the patent application discloses that the full width at half maximum, FWHM, of the bandpass in that type of filter is reduced by increasing the reflectivity at the boundaries between the layers and that this is accomplished by increasing the ratio of the high index to the low index of the materials at a boundary.

The above-described disclosure pertains to unbiased structures which may be used as passive filter devices. However, in addition to a need in the art for such passive devices, there is a need in the art for filter/emitter structures which can serve as high energy electron injectors in devices such as electroluminescent devices, photodetectors, and fast ballistic transistors.

More specifically, there is a need in the art for semiconductor devices which exhibit high speed operation. Further, it is well known that a major factor which affects the speed of semiconductor devices is the transit time of electrons from the input to the output terminals and that the transit time can be minimized and, thereby, the potential speed of the devices can be maximized, if one can provide electrons which pass through the semiconductor device without being scattered, namely, by ballistic or collisionless motion. As a consequence of this, there is a need in the art for a ballistic filter/emitter which can perform in a voltage-biased condition for use in devices such as fast ballistic transistors.

SUMMARY OF THE INVENTION

Embodiments of the present invention solve the above-identified need in the art by providing biased, semiconductor superlattice tunable electron interference filters/emitters which can serve, for example, as a hot electron emitter in a ballistic transistor. In particular, embodiments of the present invention comprise biased superlattice filter/emitters which provide energy selectivity for substantially ballistic electron wave propagation at electron energies above the superlattice potential barriers. Further, the layers of the biased superlattice comprise alternately high and low electron refractive indices wherein each layer is a multiple of a quarter or half of an electron wavelength in thickness and wherein the quantum well barrier widths are adjusted in the direction of emission to provide the desired energy selectivity.

Specifically, embodiments of the present invention comprise biased, semiconductor superlattice filter/emitters which are designed, in accordance with the inventive method, by transforming optical, thin-film interference filter designs which are designed in accordance with existing optical interference filter design methods into inventive semiconductor devices. In particular, the transformation from an optical interference filter design is performed by mapping the optical phase index of refraction into a solid state index of refraction for phase quantities which is proportional to the square root of the product of electron kinetic energy and electron effective mass and by mapping the optical amplitude index of refraction into a solid state index of refraction for amplitude quantities which is proportional to the square root of the electron kinetic energy divided by the electron effective mass. That is, the mapping makes an exact analogy between an electromagnetic optical wave and a quantum mechanical electron wave by using the electron wavevector from eqn. (1) above in place of the electromagnetic optical wavevector and by using the electron wave amplitude refractive index from eqn. (2) above in expressions for reflectivity and transmissivity at a boundary, which expressions are well known to those of ordinary skill in the art from electromagnetic design. However, in accordance with the inventive method which will be described in detail below, V in eqns. (1) and (2) is a function of position in the semiconductor materials because of the applied bias.

As will be described in further detail below in the Detailed Description, the efficacy of the above-defined mapping between electromagnetic optical waves and quantum mechanical electron waves depends on the existence of ballistic electron transport in the solid state materials, i.e., where electrons travel through the solid state materials without being scattered by deviations from crystalline perfection. In the inventive filter/emitter devices, the ballistic electrons have energies above the potential barriers in the solid state materials and exhibit quantum mechanical plane wave behavior. Further, since these plane waves will maintain their phase through the device, these coherent waves will refract, reflect, interfere, and diffract in a manner which is analogous to the behavior of electromagnetic waves traveling through dielectrics.

Doping of semiconductors within the active region of the device is not required for embodiments of the present invention, however, it is preferred that doping not be done in order to avoid scattering within the materials. This provides a further advantage for the inventive devices because the absence of doping makes them easier to fabricate.

Although electron wave propagation at energies above the potential barriers can be mathematically described by a mapping between electromagnetic optical waves in dielectrics and quantum mechanical electron waves in semiconductors, semiconductor superlattice interference filter designs cannot be copies of thin-film optical filter designs because of the following two constraints. First, the thickness of a semiconductor layer is restricted to be an integer multiple of a monolayer thickness and, second, the requirement of substantially collisionless transport for the electrons limits the usable composition ranges of the materials. The second constraint arises from the fact that collisionless transport often precludes the use of semiconductor alloy compositions which have indirect band gaps. Nevertheless, as should be clear to those of ordinary skill in the art, one may use a trial and error method of determining which designs are physically realizable. However, a preferred embodiment of the inventive method which is described in detail below comprises a systematic method for determining superlattice designs which meet these two constraints.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
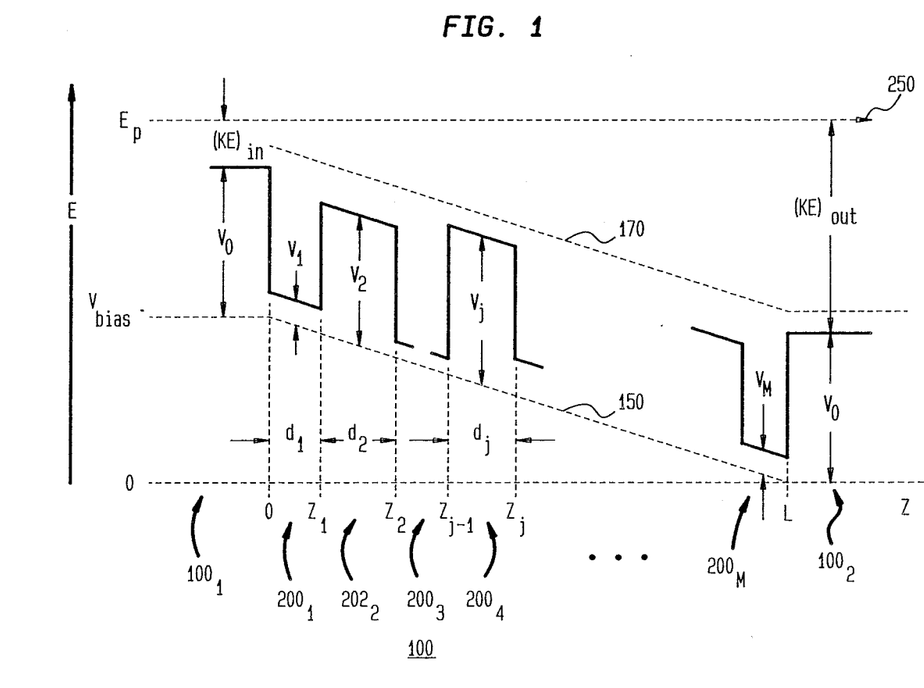
FIG. 1 shows, in pictorial form, the energy level diagram and the material composition of a biased, electron wave superlattice interference filter/emitter fabricated in accordance with the present invention.

FIG. 1 shows, in pictorial form, the energy level diagram and the material composition of voltage-biased, electron, superlattice, interference filter/emitter 100 fabricated in accordance with the present invention. Inventive filter/emitter 100 comprises M layers, layers $200_1-200_M$. Layers $200_1-200_M$ are surrounded by bulk semiconductor material layers $100_1$ and $100_2$ and a predetermined bias potential $V_{bias}/q$ is applied to filter/emitter 100 by placing a voltage source (not shown) across layers $200_1-200_M$, q being the electronic charge.

As shown in FIG. 1, electrons 250 are injected into filter/emitter 100 from layer $100_1$. Further, only those electrons having kinetic energy $(KE)_{in}$ a narrow spectral band around pass energy $E_p$—which passband energy $E_p$ is above the potential barriers of layers $200_1-200_M$—traverse filter/emitter 100 and are emitted into layer $100_2$. Still further, such electrons are emitted into layer $100_2$ with an output kinetic energy $(KE)_{out}$ which is larger than input kinetic energy $(KE)_{in}$.

In accordance with the present invention, because $(KE)_{out} > (KE)_{in}$, inventive filter/emitter 100 provides an emitter function for electrons having an incident kinetic energy of $(KE)_{in}$. As one can readily appreciate, emission of electrons from the inventive device at a kinetic energy which higher than their input kinetic energy is achieved by the application of a bias potential $V_{bias}/q$ to a filter whose filter properties are affected and determined by the resulting bias potential energy $V_{bias}$. In other words, filter/emitter 100 provides a narrow bandpass transmission filter/emitter for electrons having a specific incident kinetic energy, which electrons have a total energy which is greater than the heights of the potential barriers of the materials which comprise layers $200_1-200_M$ of the superlattice.

As will be described in detail below, the thicknesses of layers $200_1-200_M$, the compositions of the materials comprising layers $200_1-200_M$, and the heights of the potential barriers of layers $200_1-200_M$ are determined in accordance with the inventive method by utilizing a mapping between quantum mechanical electron waves in semiconductors and electromagnetic optical waves in dielectrics. The inventive method advantageously uses this mapping to apply thin film optical designs which were designed using existing optical filter design techniques to design analogous solid state quantum mechanical electron wave filter/emitter devices.

The basic structure for inventive filter/emitter 100 is that of an unbiased superlattice electron wave interference filter like those disclosed in the patent application entitled "Solid State Quantum Mechanical Electron and Hole Wave Devices" which has been incorporated by reference herein. Specifically, suitable unbiased superlattice electron wave interference filters are determined, by analogy to optical filters, to be comprised of successive layers of odd and even multiples of electron quarter wavelengths. For example, a simple type of narrow bandpass optical interference filter is a Fabry-Perot filter. It is comprised of a half-wavelength layer, frequently referred to as a "spacer" in the optical literature, which is sandwiched between reflectors. In the case of an all-dielectric Fabry-Perot optical filter, the reflectors are stacks of high index, designated H, and low index, designated L, quarter-wavelength layers. The FWHM of the bandpass of this type of filter can be reduced by increasing the reflectivity at the boundaries between the layers. This may be accomplished by increasing the ratio of the high index of refraction, $n_H$, to the low index of refraction, $n_L$. Furthermore, for a given number of layers, higher reflectances occur with the high index, H, layers on the outside boundaries of the optical filter. The half-wavelength, resonant "spacer" layer at the center of the optical filter may be of high index of refraction, $n_H$, or low index of refraction, $n_L$, material. Thus, there are two basic types of all-dielectric Fabry-Perot interference optical filters known in the art. In the optical literature, these two types of optical filters are symbolically represented as $[HL]^N HH[LH]^N$ and $H[LH]^N LL[HL]^N H$ where H and L represent quarter-wavelength layers of high and low index of refraction materials, respectively, and N represents the number of repetitions of the layer-pair type indicated in square brackets.

As further shown in FIG. 1, the $j_{th}$ barrier or quantum well has a thickness which is denoted by $d_j$ and, at zero bias, a potential energy which is denoted by $V_j$. Although these are not limitations of the present invention, to make it easier to understand the manner in which this embodiment of the present invention operates: (a) surrounding layers $100_1$ and $100_2$ are chosen to have the same zero-bias potential energy $V_o$ and (b) layers $200_1$-$200_M$ are chosen to have, alternately, low potential energy, such as, for example, $V_1$, and high potential energy, such as, for example, $V_2$. As a result of these specific choices and in accordance with the mapping of eqn. (2) above where $n_e$ is shown to be proportional to the square root of $(E-V)$, i.e., the electron kinetic energy, layers $200_1$-$200_M$ have, alternatively, high refractive index and low refractive index.

In accordance with the embodiment of present invention shown in FIG. 1, when predetermined bias potential $V_{bias}$ is applied to filter/emitter 100, layers $200_1$-$200_{R1}$ form a reflector R1 where each layer of reflector R1 is a quarter of an electron wavelength in thickness as measured in that layer at the passband energy $E_p$, layer $200_{R1+1}$ is one half of an electron wavelength in thickness as measured in that layer at the passband energy $E_p$, and layers $200_{R1+2}$-$200_M$ form a reflector R2 where each layer of reflector R2 is a quarter of an electron wavelength in thickness as measured in that layer at the passband energy $E_p$. Further, an electron wavelength of a layer is determined in accordance with eqn. (1) to be given by:

$$\text{electron wavelength} = 2\pi\hbar/[2m^*(E-V)]^{\frac{1}{2}} \quad (3)$$

The embodiment of the present invention shown in FIG. 1 is formed from a material system comprised of a continuous set of alloys of the type $F_{1-x}G_xH$. In general, such a material system will have a restricted range of usable compositions, such as the range of usable compositions denoted by the range $0 \leq x \leq x_{max}$, because there may be a transition at $x_{max}$ from a direct to an indirect energy gap like that which occurs in the $Ga_{1-x}Al_xAs$ material system at $x=0.45$.

In addition, in the embodiment of the present invention shown in FIG. 1, layers $100_1$ and $100_2$ which surround filter/emitter 100 are formed from the same material system and comprise an alloy wherein $x=x_o$. As is well known to those of ordinary skill in the art, the electron potential energy in a layer of material comprised of $F_{1-x}G_xH$ may be given by:

$$V_j = \Delta E_c = Ax_j \quad (4)$$

where $\Delta E_c$ is the change in the energy of the conduction band edge in the material and A is a constant. In accordance with eqn. (4), the range of potential energies for the given material system in fabricating embodiments of the present invention is given by $0 \leq V \leq V_{max}$. This usable range of potential energies is shown in FIG. 1 by the spread in potential energy between dotted line 150, indicative of 0 electron potential energy for the given material system, and dotted line 170, indicative of $V_{max}$ electron potential energy for the given material system.

Still further, in order for filter/emitter 100 to be physically realizable, the thickness $d_j$ of each of layers $200_1$-$200_M$ must be an integer multiple, $p_j$, of the monolayer thickness $r_j$ for the material composition of that layer.

The inventive method for providing embodiments of the present invention, comprises, as a first step, selecting a suitable unbiased superlattice electron wave interference filter like that disclosed in the patent application entitled "Solid State Quantum Mechanical Electron and Hole Wave Devices," which patent application has been incorporated by reference herein. Specifically, in that patent application, a nine layer filter, i.e., M=9, was disclosed wherein the nine layers were comprised of 72 monolayers of semiconductor material. We will now describe how an embodiment of the present invention is designed in accordance with the remaining steps of the inventive method so that specific material compositions and layer thicknesses are determined. In particular, the disclosed embodiment of inventive filter/emitter 100 will filter electrons having an input kinetic energy of 0.10 eV, i.e., $KE_{in}=0.10$ eV, and emit them with a kinetic energy of 0.20 eV, i.e., $KE_{out}=0.20$ eV. In this case, since $V_{bias}$ equals the difference between the output and input kinetic energy, i.e., output kinetic energy $(KE)_{out}$ is equal to $V_{bias}+(KE)_{in}$, $V_{bias}$ will equal 0.10 eV.

In the notation of optical thin film design, H indicates a quarter-wavelength thickness layer of high index (as measured in the medium), and L indicates a quarter-wavelength thickness layer of low index (as measured in the medium). Thus, the notation HH signifies a half-wavelength thickness layer of high index. The disclosed embodiment of inventive filter/emitter 100 comprises nine layers wherein: (1) layer 1 is a high index, quarter-wavelength layer (H); (2) layer 2 is a low index, quarter-wavelength layer (L); (3) layer 3 is a high index, quarter-wavelength layer (H); (4) layer 4 is a low index, quarter-wavelength layer (L); (5) layer 5 is a high index, half-wavelength layer (HH); (6) layer 6 is a low index, quarter-wavelength layer (L); (7) layer 7 is a high index, quarter-wavelength layer (H); (8) layer 8 is a low index, quarter-wavelength layer (L); and (9) layer 9 is a high index, quarter-wavelength layer (H).

We will now describe the inventive design method. First, we will describe how the thickness of a semiconductor layer which is a multiple of a quarter of an electron wavelength at a given electron pass energy $E_p$ is determined. For the $j^{th}$ layer of filter/emitter 100 to be a quarter of an electron wavelength in thickness at the pass energy $E_p$, the phase difference of the electron wave between the input boundary to the $j^{th}$ layer, i.e., at $z_{j-1}$ in FIG. 1, and the output boundary to the $j^{th}$ layer, at $z_j$ in FIG. 1, must be an odd multiple of $\pi/2$ given by $(2q_j-1)\pi/2$. This condition is written as follows:

$$\int_{z_{j-1}}^{z_{jkj}} dz = \int_{z_{j-1}}^{z_j} \{2 m_j^*[E_p - V_j(z)]\}^{\frac{1}{2}}/\hbar dz \qquad (5)$$
$$= (2q_j - 1)\pi/2$$

The potential energy $V_j(z)$ in the $j^{th}$ layer is given by:

$$V_j(z) = V_{bias}(1-z/L) + V_j \qquad (6)$$

where L is the total length of superlattice 100 and $q_j$ is a positive integer.

The pass energy for filter/emitter 100 is given as:

$$E_p = V_{bias} + V_o + (KE)_{in} \qquad (7)$$

where $(KE)_{in}$ is the pass kinetic energy in input layer $100_1$.

The effective mass of the $j^{th}$ layer is given by:

$$m^*_j = (B + Cx_j)m_o \qquad (8)$$

where B and C are constants and $m_o$ is the free electron mass.

Using $V_j = Ax_j$ one obtains the following "quarter-wavelength" condition:

$$\{2L[2m_o(B + Cx_j)]^{\frac{1}{2}}/3\hbar V_{bias}\}*\{[V_o + (KE)_{in} - Ax_j + \qquad (9)$$
$$V_{bias}z_j/L]^{3/2} - [V_o + (KE)_{in} - Ax_j + V_{bias}z_{j-1}/L]^{3/2}\} =$$
$$(2q_j - 1)\pi/2$$

Eqn. (9) is solved to determine the composition $x_j$ of the $j^{th}$ layer.

Let:
(1) i be an index which counts the number of monolayers of material which comprise inventive filter/emitter 100;
(2) $i_j$ denote the number of the rightmost monolayer in the $j^{th}$ layer of inventive filter/emitter 100; and
(3) $i_M$ denote the total number of monolayers in inventive filter/emitter 100.

Using this notation:
(1) the thickness of the $j^{th}$ layer is given by $d_j = p_j r_j$ where $p_j = i_j - i_{j-1}$ is the number of monolayers in the $j^{th}$ layer and $r_j$ is the thickness of a monolayer of material composition $x_j$ for the $j^{th}$ layer;
(2) the total thickness of inventive filter/emitter 100 is given by L = sum of $p_j r_j$ which is equal to $i_M r$ for a material system having $r_j$ be the same value, r, for all layers;
(3) the distance along inventive filter/emitter 100 from one end to the beginning of the $j^{th}$ layer is given by $z_{j-1}$ and $z_{j-1} = (i_{j-1}/i_M)*L$ when all $r_j$ are the same; and
(4) the distance along inventive filter/emitter 100 from one end to the end of the $j^{th}$ layer is given by $z_j$ and $z_j = (i_j/i_M)*L$ when all $r_j$ are the same.

In terms of this notation, the inventive method comprises the following steps:

(1) for the first layer, set $i_o$ equal to 0 and set $j = 0$.

(2) increment the value of $i_j$ for the next value of j by 1, for example, $i_1 = 1$. For quarter-wavelength layers, set $q_j$ equal to 1 and, for half-wavelength layers, use $\pi$ instead of $\pi/2$, where $(2q_j - 1)$ is the number of quarter wavelengths for the $j^{th}$ layer.

(3) solve eqn. (9) for $x_j$ using j, the previously determined value of $i_{j-1}$, and the preset value of $i_j$, where $x_j$ is the composition of the $j^{th}$ layer. For a high electron refractive index layer, choose the positive real value of $x_j$ which is closest to zero and, for a low electron refractive index layer, choose the resulting real value of $x_j$ which is closest to, but less than the value where a transition from a direct band gap to an indirect band gap occurs, for example, this value is 0.45 for the GaAlAs material system. If there are more layers to do, go back to step 2, otherwise go on to step 4.

(4) If the total number of monolayers that have been determined after the last step has been completed are more than or less than the initial estimate of the number of monolayers $i_M$, then one must revise the initial estimate and go back to step one to try again.

The above-described process is repeated until the optimum thickness, corresponding to the value of $x_M$ closest to zero, of the last layer produces a total thickness for inventive filter/emitter 100 which is in self-consistent agreement with the initial estimate of $i_M$ used in the design.

We have applied the inventive method to design inventive filter/emitter 100. As set forth above, in this embodiment, layers $200_1$ to $200_9$ and surrounding layers $100_1$ and $100_2$ are comprised of materials from the $Ga_{1-x}Al_xAs$ material system. This is an advantageous material system because all compositions are lattice matched for these alloys and because, for growth along the [100] direction, the monolayer thickness is the same, i.e., $r_j = r = 2.82665$ Å. Further, a composition in this material system is a direct gap semiconductor for x less than or equal to 0.45 and, as a result, this represents the usable composition range. Still further, for $Ga_{1-x}Al_xAs$, $A = 0.77314$ eV, $B = 0.067$ and $C = 0.083$. Yet still further, in this embodiment we will use surrounding layers $100_1$ and $100_2$ which are comprised of the same composition, $Ga_{0.55}Al_{0.45}As$, having $x_o = 0.45$.

The design for the nine-layer embodiment of filter/emitter 100 in the $Ga_{1-x}Al_xAs$ system having input kinetic energy of 0.10 eV and output kinetic energy of 0.20 eV, which embodiment might be useful as an emitter in a high speed ballistic transistor, is set forth in TABLE A. The effective masses used in the design of filter/emitter 100 were taken from prior art literature to be $m^*(GaAs) = 0.067 m_0$ and $m^*(Ga_{0.55}Al_{0.45}As) = 0.10435 m_0$, where $m_0$ is the free electron mass. The conduction band edge energies used were $V(GaAs) = 0.0000$ eV and $V(Ga_{0.55}Al_{0.45}As) = 0.3479$ eV. In this design the total thickness of inventive filter/emitter 100 is 71 monolayers, which thickness corresponds to a length $L = 20.0692$ nm. This illustrates the fact that the length of such an embodiment of inventive filter/emitter 100 is short enough so that it may be fabricated from thin layers of ballistic semiconductor materials.

As a check on the methodology presented above, we have computed the electron current transmittance for the biased superlattice design described in TABLE A. Since the bias provides a linear potential decrease, the electron wavefunction in any layer of filter/emitter 10 may be expressed as a linear combination of Airy functions $Ai(\rho)$ and complementary Airy functions $Bi(\rho)$, where a new variable $\rho_j$ is defined within the $j^{th}$ layer as follows:

$$\rho_j = (2m^*_j V_{bias} n^2 L)^{\frac{1}{3}}\{z + (E - V_{bias} - V_j)L/V_{bias}\} \qquad (10)$$

For the stack of M layers shown in FIG. 1, the total normalized transmitted electron wave amplitude $U_{t,M+1}$ in layer $M+1$ and the total normalized reflected electron wave amplitude $U_{r,o}$ in layer 0 may be expressed as:

$$\begin{bmatrix} 1 \\ U_{r,0} \end{bmatrix} = \frac{1}{2jK_1} \begin{bmatrix} -jK_1 & -1 \\ jK_1 & 1 \end{bmatrix} [S_1(z_0)][S_1(z_1)]^{-1}[S_2(z_1)]*$$

$$*[S_2(z_2)]^{-1}[S_3(z_2)] \ldots [S_{M-1}(z_{M-1})]^{-1}*$$

$$*[S_M(z_{M-1})][S_M(z_M)]^{-1} \begin{bmatrix} 1 & 1 \\ -jK_2 & jK_2 \end{bmatrix} \begin{bmatrix} U_{t,M+1} \\ 0 \end{bmatrix}$$

where:

(a)

$$[S_j(z)] = \begin{bmatrix} Ai(-\rho_j) & Bi(-\rho_j) \\ Ai'(-\rho_j)(1/M_j^*)^{2/3} & Bi'(-\rho_j)(1/M_j^*)^{2/3} \end{bmatrix}$$

(b) $K_1 = \{(2m_o/\hbar^2)^{\frac{1}{2}}(E-V_o-V_{bias})/M^*_o\}^{\frac{1}{2}}(L/V_{bias})^{\frac{1}{2}}$;
(c) $K_2 = \{(2m_o/\hbar^2)^{\frac{1}{2}}(E-V_O)/M^*_{M+1}\}^{\frac{1}{2}}(L/V_{bias})^{\frac{1}{2}}$;
(d) $M^*_j = m^*_j/m_o$; and
(e) ' indicates the derivative.

These equations can be solved directly for the amplitude transmittance $U_{t,M-1}$ to provide the electron transmittance $T_e = \alpha |U_{t,M+1}|^2$, where:

$$\alpha = [(E-V_o-V_{bias})/M^*_0]^{\frac{1}{2}}/[(E-V_o)/M^*_{M+1}]^{\frac{1}{2}}$$

Figure 2:
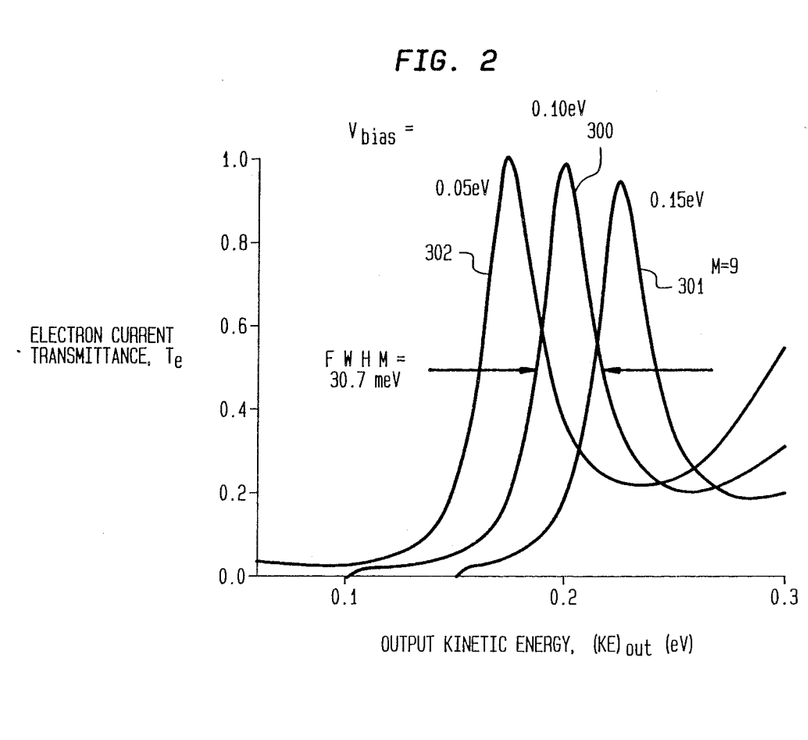
FIG. 2 shows, in pictorial form, the transmissivity of the electron superlattice interference filter of FIG. 1.

$T_e$ is shown in FIG. 2 for the biased superlattice design described in TABLE A. At the design bias of $V_{bias} = 0.10$ eV, i.e., curve 300, the device emits (KE) $_{out} = 0.20$ eV electrons into output layer 100$_2$. The full-width-at-half-maximum (FWHM) is 30.7 meV or 15.35% of the center energy.

Further, the output kinetic energy from inventive filter/emitter 100 is continuously tunable, i.e., the peak of the curve can be shifted and the curve maintains a shape which provides for a filtering function. In particular, the peak of the output kinetic energy is shifted by changing the bias potential energy $V_{bias}$ applied to inventive filter/emitter 100. Since the HH resonant layer is at the center of the device, as measured in electron optical path length, the shift in the peak of the output kinetic energy is equal to one-half of the change in the bias potential energy, i.e., as the bias potential energy is changred by 50 meV, the peak of the output kinetic energy is shifted by 25 meV. Thus, as shown in FIG. 2, for a change in $V_{bias}$ of $\pm 50$ meV, curves 301 and 302 show that the outpout kinetic energy is shifted by $\pm 25$ meV. Note however, that the transmittance for the different curves is different. This property of continuous tunability provides a substantial advantage for embodiments of the inventive filter/emitter, aside from flexibility, in that the bias potential energy may be varied to tune an embodiment which is fabricated with output characteristics that deviate from strict conformance with a predetermined design.

It is important to note that the extent to which practical embodiments of the inventive devices conform with the designs described herein depends on the amount of ballistic motion which occurs in the materials out of which they are fabricated. This means that the behavior of the inventive devices will more closely resemble the desired and designed characteristics if electron transport within the materials is substantially ballistic. However, it is also important to note that the inventive devices will also perform in accordance with the designed characteristics albeit in a degraded fashion, if electron transport is not substantially ballistic, i.e., their performance will "gracefully" degrade. However, present fabrication techniques in molecular beam epitaxy (MBE) and metal organic chemical vapor deposition (MOCVD), enable those of ordinary skill in the art to grow multilayered superlattice structures with precise monolayer compositional control and with materials which provide substantially ballistic electron transport. In addition, doping of semiconductors is not important for the embodiments of the present invention, however, it is preferred to exclude doping within the active region of the device in order to avoid scattering within the materials. This provides a further advantage for the inventive devices because the absence of doping makes them easier to fabricate.

Although there is no prohibition in principle against the use of indirect bandgap materials, they cannot be used where the transition between a direct and an indirect bandgap material or between two indirect bandgap materials requires a change in momentum. This is because we are dealing with wave effects that occur in substantialy collisionless motion.

Important characteristics of all-dielectric optical interference filters which are well known to those of ordinary skill in the art, also apply to the inventive solid state electron wave filter/emitters, namely: (1) the maximum transmittance occurs at the wavelength for which (a) the "spacer" layer is a half-wavelength thick, as measured in that material, and (b) the reflected layers are a quarter-wavelength thick, as measured in those materials, which wavelength will be referred to below as the pass wavelength; (3) the FWHM and the finesse are controlled by the number of surrounding quarter-wavelength layers, i.e., the FWHM is decreased and the finesse is increased as further quarter-wavelength sections are added; (4) the transmittance characteristic is symmetric about the pass wavelength when the transmittance characteristic is plotted as a function of the reciprocal of the wavelength, as measured in the material surrounding the filter; (5) a proportional change in the thicknesses of all layers produces a simple displacement of the transmittance characteristic plotted as a function of the reciprocal wavelength; (6) if the thicknesses of all layers are increased by an odd integer factor, a passband will occur at the original pass wavelength and it will have a decreased FWHM; (7) as the angle of incidence upon the filter is increased, the pass wavelength is tuned to shorter wavelengths; (8) the transmittance characteristic is relatively insensitive to variations in the reflectivities and thicknesses of the layers; (9) normal dispersion causes a narrowing of the FWHM; and (10) the filter is effective over only a limited range since sidebands necessarily occur on either side of the passband.

It should be clear to those of ordinary skill in the art that the inventive superlattice devices may be comprised of layers which have a multiplicity of differing material compositions. Further, it is well know to those of ordinary skill in the art as to how a bias potential $V_{bias}$ may be applied to inventive filter/emitter by, for example, applying electrodes to layers 200$_1$ and ⓡ$_M$ of FIG. 1 and by applying a source across these electrodes.

Note that, like their thin-film optical counterparts, semiconductor superlattice filter/emitters will be relatively insensitive to variations about the design composition values. Further: (1) although semiconductor materials (a) may have nonparabolic bandstructure in terms of E vs. k, i.e., energy vs. momentum, and (b) may have band structures which vary with a particular direction of electron wave propagation in the material, these effects may be incorporated into the inventive design method by using an energy dependent, anisotropic effective mass m*. Thus, even though an allowed wavevector surface is no longer spherical in the presence of anisotropy, all of the inventive design methods set forth herein still apply, provided the energy dependent anisotropic effective mass is used in the analysis.

Clearly, those skilled in the art recognize that further embodiments of the present invention may be made without departing from its teachings. For example, it is within the spirit of the present invention to provide a wide variety of hole wave devices as well as electron wave devices. In addition, it is within the spirit of the present invention that a wide variety of electron or hole wave filter/emitter devices can be fabricated. Further in addition, such inventive devices may be used to provide narrowband semiconductor superlattice interference filter/emitters for use as hot electron emitters for an entire class of devices such as electroluminescent devices, photodetectors, and ballistic transistors and so forth. Still further in addition, such inventive devices may be used to aid in controlling, shaping and filtering freespace electron beams to provide electon spectrometers, electron lithography and electron diffraction analysis of cyrstals.

Lastly, it should be clear to those of ordinary skill in the art that appropriate solid state materials for use in fabricating embodiments of the present invention include semiconductor mateirals such as, without limitation, binary, ternary and quaternary compositions of, among others, III-V elements and II-VI elements.

TABLE A

Design Parameters of Electron Interference Filter/Emitter Comprised of Nine Layers in an [H L H L HH L H L H] Configuration Surrounded by $Ga_{0.55}Al_{0.45}As$ and Designed to Emit 0.200 eV Electrons When Biased at 0.100 eV.

| Layer Number $j$ | Layer Type | Starting Monolayer Number $i_{j-1}$ | Ending Monolayer Number $i_j$ | Number Monolayers Thick $p_j$ | Al Comp. $x_j$ | Unbiased Electron Potential Energy $V_j$ | Normalized Effective Mass $m^*_j/m_o$ |
|---|---|---|---|---|---|---|---|
| 1 | H | 0 | 7 | 7 | 0.2222 | 0.1718 | 0.0854 |
| 2 | L | 7 | 16 | 9 | 0.4151 | 0.3209 | 0.1015 |
| 3 | H | 16 | 23 | 7 | 0.2663 | 0.2059 | 0.0891 |
| 4 | L | 23 | 32 | 9 | 0.4493 | 0.3473 | 0.1043 |
| 5 | HH | 32 | 44 | 12 | 0.0639 | 0.0494 | 0.0723 |
| 6 | L | 44 | 52 | 8 | 0.4364 | 0.3374 | 0.1032 |
| 7 | H | 52 | 58 | 6 | 0.1442 | 0.1115 | 0.0790 |
| 8 | L | 58 | 65 | 7 | 0.3748 | 0.2898 | 0.0981 |
| 9 | H | 65 | 71 | 6 | 0.1951 | 0.1508 | 0.0832 |

What is claimed is:

1. A solid state, quantum mechanical, electron wave filter/emitter which comprises:
   a superlattice structure which is comprised of a multiplicity of adjacent layers of semiconductor material, each of which layers has a pontential energy barrier and supports substantially ballistic electron transport at energies above the potential energy barrier of the layer and
   means for applying a bias potential energy to the superlattice structure wherein the potential energy barriers, electron effective masses, and thicknesses of the layers of the superlattice structure are predetermined as if a predetermined bias potential has been applied to the applying means so that the application of the predetermined bias potential to the applying means causes the filter/emitter to function as a filter/emitter for electrons having kinetic energies in a predetermined range.

2. The filter/emitter of claim 1 wherein at least one of the layers of the superlattice structure has a thickness which is substantially equal to an integral multiple of an electron quarter-wavelength in the layer, the electron wavelength being determined as if the predetermined bias potential has been applied to the applying means.

3. The filer/emitter of claim 2 wherein the superlattice structure is comprised of a first reflector, a spacer, and a second reflector wherein:
   the first reflector is comprised of a predetermined number of adjacent pairs of adjacent layers of the superlattice structure, each layer of the pair having a thickness which is substantially equal to an odd multiple of an electron quarter-wavelength in the layer, the electron wavelength being determined as if the predetermined bias potential has been applied to the applying means;
   the spacer is comprised of a layer of the structure having a thickness which is substantially equal to an integral multiple of an electron quarter-wavelength in the layer, the electron wavelength being determined as if the predetermined bias potential has been applied to the applying means; and
   the second reflector is comprised of a predetermined number of adjacent pairs of adjacent layers of the structure, each layer of the pair having a thickness which is substantially equal to an odd multiple of an electron quarter-wavelength in the layer, the electron wavelength being determined as if the the predetermined bias potential has been applied to the applying means.

4. The filter/emitter of claim 3 wherein:
   the two layers in each pair of layers of the first reflectore have different electron wave amplitude refractive indices and
   and two layers in each layers of the second reflector have different electron wave amplitude refractive indices.

5. The filter/emitter of claim 4 wherein:
   a first layer of each pair of layers of the first reflector having a higher electron wave amplitude index of refraction than that of a second layer of the pair, the pairs of layers being arranged so that the first layer is followed by the second layer as one proceeds from a first end of the filter/emitter to a second end of the filter/emitter; and a first layer of each pair of layers of the second reflector having a higher electron wave amplitude index of refraction than that of a second layer of the pair, the pair of layers being arranged so that the second layer is followed by the first layer as one proceeds from the first end to the second end.

6. The filter/emitter of claim 4 wherein:

a first layer of each pair of layers of the firrst reflector having a higher electron wave amplitude index of refraction than that of a second layer of the pair, the pairs of layers being arranged so that the second layer is followed by the first layer as one proceeds from a first ends of the filter/emitter to a second end of the filter/emitter;

a first layer of each pair of layers of the second reflector having a higher electron wave amplitude index of refraction than that of a second layer of the pair, the pair of layers being arranged so that the first layer is followed by the second layer as one proceeds from the first end to the second end.

7. The filter/emitter of claim 2 wherein the superlattice structure is comprised of alternating layers of a first semiconductor material and a second semiconductor material and one end of the filter/emitter is adjacent a layer of semiconductor material having a first predetermined conduction band height and the other end of the filter/emitter is adjacent a layer of semiconductor material having a second predetermined conduction band height.

8. The filter/emitter of claim 7 wherein at lest one of the first and second semiconductor materials is a binary, ternary or quaternary semiconductor composition of III-V elements.

9. The filter/emitter of claim 1 wherein the layers of the superlatticestructure alternately have a first and a second electron wave amplitude index of refraction, the first index of refraction being higher than the second index of refraction, each layer having a thickness which is substantially equal to an integral multiple of a quarter of an electron wavelength in the layer, the electron wave applitude index of refraction and electron wavelength being determined as if the predetermined bias potential has been applied to the applying means.

10. A solid state quantum mechanical, hole wave filter/emitter which comprises:

a superlattice structure which is comprised of a multiplicity of adjacent layers of semiconductor material, each of which layers has a potential energy barrier and supports substantially ballistic hole transport at energies above the potential energy barrier of the layer and means for applying a bias potential energy to the superlattice structure; wherein the potential energy barriers hole effective masses, and thicknesses of the layers of the superlattice structure are predetermined as if a predetermined bias potential has been applied to the applying means so that the application of the predetermined bias potential to the applying means causes the filter/emitter to function as a filter/emitter for holes having kinetic energies in a predetermined range.

11. The filter/emitter of claim 7 wherein at least one of the first and second semiconductor materials is a material selected from binary, ternary and quaternary semiconductor compositions of II-VI elements.

12. The filter/emitter of claim 10 wherein at least one of the layers of the superlattice structure has a thickness which is substantially equal to an integral multiple of an electron quarter-wavelength in the layer, the electron wavelength being determined as if the predermined bias potential has been applied to the applying means.

* * * * *

UNITED STATES PATENT AND TRADEMARK OFFICE
CERTIFICATE OF CORRECTION

PATENT NO. : 4,987,458

DATED : January 22, 1991

INVENTOR(S) : Thomas K. Gaylord, et al.

It is certified that error appears in the above-indentified patent and that said Letters Patent is hereby corrected as shown below:

Column 1 col. 1, line 6    "DDAL03-87-K-0059" should be "DAAL03-87-K-0059"
col. 1, line 47    "inter-ferred" should be "inter-fered"
col. 1, eqn. (1)    "$\bar{n}$" should be "$\hbar$"
col. 1, line 57    "$\bar{n}$" should be "$\hbar$"
col. 1, eqn. (2)    "$\alpha$" should be "$\propto$" (That is, alpha should be changed to "proportional to" sysmbol.)
col. 1, eqn. (2)    There should be a space before and after "$\alpha$"
col. 1, line 66    "many boundary" should be "many-boundary"

Column 4 col. 4, line 20    "$(KE)_{in}$" should be "$(KE)_{in}$ in"
col. 4, line 21    Use regular length hyphen rather than long hyphen.
col. 4, line 23    Use regular length hyphen rather than long hyphen.
col. 4, line 32    "which" should be "which is"

Column 5 col. 5, eqn. (3)    "$\bar{n}$" should be "$\hbar$"

Column 7 col. 7, eqn. (5)    $k_j$ should be moved down so that it is on the same line as "$dz$". It should read "$k_j dz$"
col. 7, eqn. (9)    Move "(9)" to end of equation.
col. 7, eqn. (9)    Add small space between "$V_{bias}$" and "$z_j$" in two places.

Column 8 col. 8, line 31    Change "r = 2.82665 A" to "r = 0.282665 nm"
col. 8, line 38    "$x_{0=}0.45$" should be "$x_0 = 0.45$" ("=" should not be a subscript.)
col. 8, line 46    "and m*(Ga" should not be a subscript.
col. 8, eqn. (10)    "$V_{bias}\bar{n}^2$" should be "$V_{bias}/\hbar^2$"

Page 1 of 4

UNITED STATES PATENT AND TRADEMARK OFFICE
CERTIFICATE OF CORRECTION

PATENT NO. : 4,987,458
DATED : January 22, 1991
INVENTOR(S) : Thomas K. Gaylord, et al.

It is certified that error appears in the above-indentified patent and that said Letters Patent is hereby corrected as shown below:

Column 9 col. 9, line 8    "$-jK_1$" should be "$jK_1$" (Remove $-$ sign.)
col. 9, line 8    Adjust horizontal parts at top of brackets ([]) so that they are aligned with vertical parts.
col. 9, line 9    Add horizontal parts at bottom of brackets ([]) so that they are aligned with vertical parts.
col. 9, line 13   Separate "$-jK_2$" and "$jK_2$" so that "$-jK_2jK_2$" becomes "$-jK_2\ jK_2$"
col. 9, line 12   Adjust horizontal parts at top of brackets ([]) so that they are aligned with vertical parts.
col. 9, line 13   Add horizontal parts at bottom of brackets ([]) so that they are aligned with vertical parts.

col. 9, line 19   Adjust horizontal parts at top of brackets ([]) so that they are aligned with vertical parts.

col. 9, line 21   Add horizontal parts at bottom of brackets ([]) so that they are aligned with vertical parts.
col. 9, line 21   Separate "Ai" and "'" so that they do not run together.
col. 9, line 21   Separate "Bi" and "'" so that they do not run together.

col. 9, line 21   Separate "$Ai'(-\rho_j)(1/M_j^*)^{2/3}$" and "$Bi'(-\rho_j)(1/M_j^*)^{2/3}$" so that "$Ai'(-\rho_j)(1/M_j^*)^{2/3}Bi'(-\rho_j)(1/M_j^*)^{2/3}$" becomes "$Ai'(-\rho_j)(1/M_j^*)^{2/3}\ Bi'(-\rho_j)(1/M_j^*)^{2/3}$"

col. 9, line 23   "$\bar{n}$" should be "$\hbar$"
col. 9, line 24   "$\bar{n}$" should be "$\hbar$"
col. 9, line 24   "$V_0$" should be "$V_0$"
col. 9, line 28   "$U_{t,M-1}$" should be "$U_{t,M+1}$"

UNITED STATES PATENT AND TRADEMARK OFFICE
CERTIFICATE OF CORRECTION

PATENT NO. : 4,987,458
DATED : January 22, 1991
INVENTOR(S) : Thomas K. Gaylord, et al.

It is certified that error appears in the above-indentified patent and that said Letters Patent is hereby corrected as shown below:

col. 9, line 31  "$(E - V_0 - V_{bias})$" should be "$(E_0 - V_0 - V_{bias})$" (Add 0.)

col. 9, line 31  Then reverse "$[(E_0 - V_0 - V_{bias})/M^*_0]^{\frac{1}{2}}$" and "$[(E - V_0)/M^*_{M+1}]^{\frac{1}{2}}$"

so that the expression reads as follows:

$$\alpha = [(E - V_0)/M^*_{M+1}]^{\frac{1}{2}} / [(E_0 - V_0 - V_{bias})/M^*_0]^{\frac{1}{2}}$$

col. 9, line 34  "$(KE)_{out}$" should not be divided between lines.
col. 9, line 49  "changred" should be "changed"
col. 9, line 52  "outpout" should be "output"
col. 9, line 54  "different curves" should be "various curves"

Column 10 col. 10, line 25  "substantialy" should be "substantially"
col. 10, line 61  "know" should be "known"
col. 10, line 64  "$R_H$" should be "$200_H$"

Column 11 col. 11, line 31  "cyrstals" should be "crystals"
col. 11, line 35  "mateirals" should be "materials"
col. 11, line 61  "pontential" should be "potential"

Column 12 col. 12, line 13  "filer" should be "filter"
col. 12, line 26  "quarter-" should be "half-"
col. 12, line 35  "the the" should be "the"
col. 12, line 59  "reflec-tore" should be "reflec-tor"
col. 12, line 61  "each layers" should be "each pair of layers"

UNITED STATES PATENT AND TRADEMARK OFFICE
CERTIFICATE OF CORRECTION

PATENT NO. : 4,987,458
DATED : January 22, 1991
INVENTOR(S) : Thomas K. Gaylord, et al.

It is certified that error appears in the above-indentified patent and that said Letters Patent is hereby corrected as shown below:

Column 13 col. 13, line 11 "firrst" should be "first"
col. 13, line 16 "first ends" should be "first end"
col. 13, line 33 "lest" should be "least"
col. 13, line 38 "superlatticestructure" should be "superlattice structure"

Column 14 col. 14, line 19 "barriers hole effective masses" should be "barriers, hole effective masses" (Add comma after barriers.)
col. 14, line 6 "applitude" should be "amplitude"
col. 14, line 36 "predermined" should be "predetermined"

Signed and Sealed this

Tenth Day of May, 1994

BRUCE LEHMAN

Attesting Officer     Commissioner of Patents and Trademarks